United States Patent [19]

Gudgel

[11] 4,134,061

[45] Jan. 9, 1979

[54] PIPE CURRENT DETECTOR WITH PLURAL MAGNETIC FLUX DETECTORS

[76] Inventor: Howard S. Gudgel, 7326 E. 59 Pl., Tulsa, Okla. 74145

[21] Appl. No.: 764,727

[22] Filed: Feb. 2, 1977

[51] Int. Cl.² .................... G01R 19/14; G01R 31/08; G01N 27/00
[52] U.S. Cl. .......................................... 324/54; 324/3; 324/52; 324/71 R
[58] Field of Search ............... 324/54, 67, 3, 52, 71 R, 324/37, 40, 241, 242, 243

[56] References Cited

U.S. PATENT DOCUMENTS

| | | | |
|---|---|---|---|
| 1,297,929 | 3/1919 | Taylor | 324/67 X |
| 2,382,743 | 8/1945 | Penther et al. | 324/67 |
| 2,501,598 | 3/1950 | Eltenton et al. | 324/67 |
| 3,305,711 | 2/1967 | Quittner | 324/242 X |
| 3,526,831 | 9/1970 | Smith | 324/54 |
| 3,617,865 | 11/1971 | Hakata | 324/3 |
| 3,745,452 | 7/1973 | Osburn et al. | 324/54 |
| 3,836,848 | 9/1974 | Blevins | 324/67 |
| 3,889,179 | 6/1975 | Cutler | 324/3 |
| 3,907,136 | 9/1975 | Christides et al. | 324/67 X |
| 3,988,663 | 10/1976 | Slough et al. | 324/3 |

FOREIGN PATENT DOCUMENTS

| | | | |
|---|---|---|---|
| 577080 | 5/1946 | United Kingdom | 324/52 |
| 504988 | 2/1976 | U.S.S.R. | 324/52 |

Primary Examiner—Gerard R. Strecker
Attorney, Agent, or Firm—Head, Johnson & Chafin

[57] ABSTRACT

Apparatus for measurement, above the surface of the ground, of an electrical current flowing in a buried pipeline, comprises a pair of magnetic flux detectors oriented with their axes vertical, and spaced apart, in a frame, which is moved along the earth at a substantially constant elevation above the surface, with the plane through the two vertical detectors substantially perpendicular to the direction of the pipe. Means are provided, including a vertical core and coil centered on the frame, for indicating the position of the frame laterally with respect to the buried pipe. There is also a second core and coil displaced laterally from the first core and coil, for determining the depth of the pipe below the frame. When the frame is centered over the pipe and there is current in the pipe, flux will pass upwardly through a first flux detector core and downwardly through the second flux detector core. One or a plurality of coils and suitable measuring instruments can determine the magnitude of the flux through the core and therefore, the magnitude and direction of the current flowing in the pipe.

9 Claims, 5 Drawing Figures

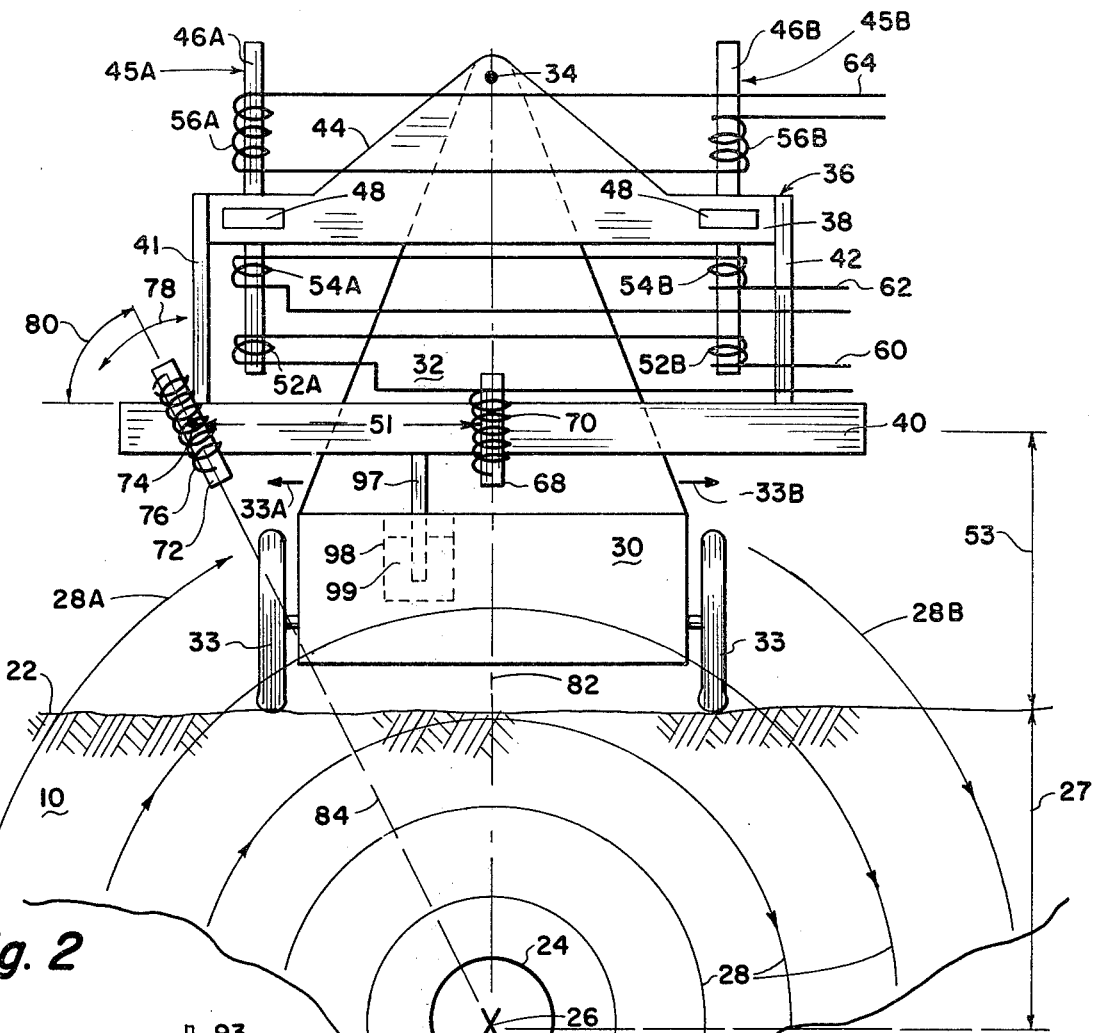
Fig. 2
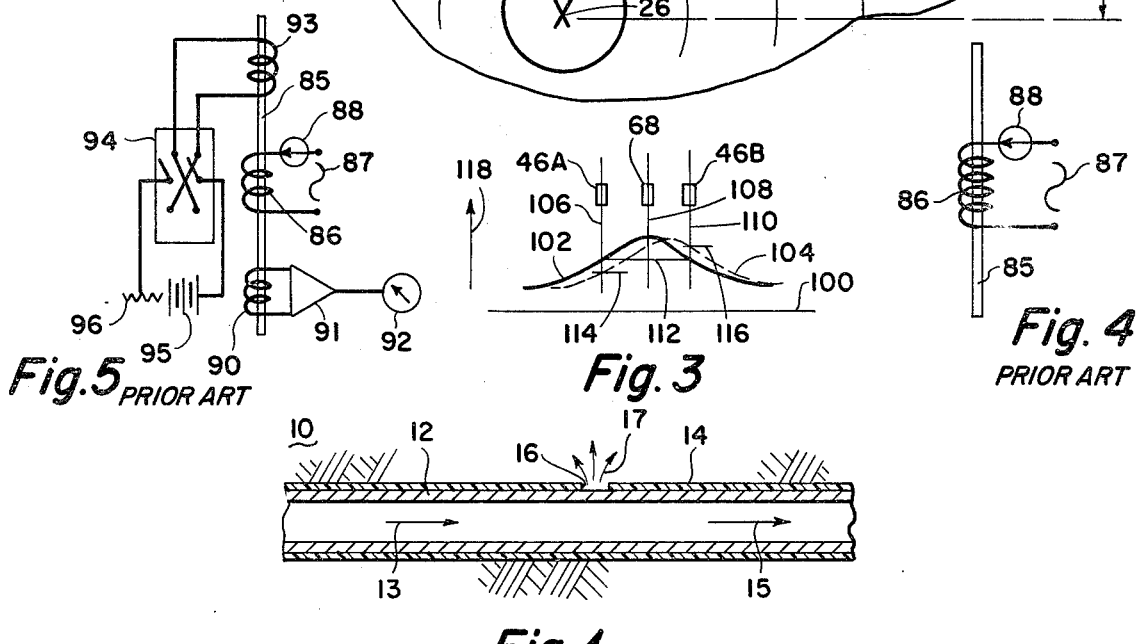
Fig. 5 PRIOR ART
Fig. 3
Fig. 4 PRIOR ART
Fig. 1

PIPE CURRENT DETECTOR WITH PLURAL MAGNETIC FLUX DETECTORS

BACKGROUND OF THE INVENTION

1. Field of the Invention

This invention lies in the field of underground pipeline cathodic protection.

More particularly, it is concerned with apparatus for detecting, by measurement above the surface of the earth, the flow of electrical current in a pipeline below the surface of the earth.

It is still further concerned with the measurement of current in a pipeline below the surface of the ground, by determination of the difference in flux in two identical magnetic flux detectors, which are symmetrically placed above the earth, one on each side of the buried pipeline.

2. Description of the Prior Art

In any industry, such as the oil industry, which utilizes underground pipelines, it is well known that a ferrous pipe will corrode under certain circumstances of moisture and impurities in the metal of the pipe, etc. To counteract this electrolytic corrosion, pipelines are often coated with an electrically insulating material which is securely bonded to the pipe so as to avoid the passage of an ionic current from the pipe to the earth surrounding it.

It is also well known that, in other circumstances, it is the custom to provide a source of DC voltage between the earth and the pipe where the pipe is negative with respect to the grounded end of the source. Thus a current is set up to flow from the earth to the pipe, this current being larger than any possible current in the reverse direction, which might be set up due to electrolytic conditions. Consequently, since there is no flow of ionic current from the pipe to the earth, there will be no ions travelling in that direction that would serve to remove metal atoms from the pipe, and therefore eventually cause corrosion and perforation of the pipe.

It is also customary under certain conditions to use cathodic protection, which comprises connecting a conductor between the pipe and a buried piece of metal of the type such as aluminum or magnesium, which has a lower electrochemical potential than the iron of the pipe, so that the electrolytic cell comprising the buried aluminum or magnesium, and the iron, with the moist earth as electrolyte, will cause a current to flow from the anode through the earth to the pipe, and so prevent the flow of ions in the opposite direction.

It is often found however that even with an electrically insulating coating on the pipe, that pinholes, breaks, or holidays in the coating are often accidentally or otherwise formed, which permit currents to flow from the pipe to the earth, and to set up in the pipe longitudinally flowing currents, which can be detected by the apparatus of this invention.

SUMMARY OF THE INVENTION

It is the primary object of this invention to provide an apparatus that can be used for making a measurement at a point above the earth, of the presence and magnitude of an electrical current flowing in a buried conductor below the surface of the earth.

It is a still further object of this invention to provide apparatus for determining the point at which the current flows into or out of the buried conductor from or to the earth.

These and other objects are realized and the limitations of the prior art are overcome in this invention by providing a pair of magnetic flux detectors, which are sensitive to the presence of magnetic flux through the cores of the detectors. The two detectors are mounted above the earth, parallel to each other, and in a vertical plane, with the detector cores aligned vertically, one on either side of the buried pipe. The two magnetic flux detectors are supported in a non-magnetic frame and are maintained in a vertical direction by having the frame suspended from a horizontal axis. Gravity then keeps the frame in a horizontal direction, with the cores aligned vertically. Damping means is provided for reducing oscillation of the frame.

A support for the frame is provided on a vehicle of non-magnetic material. The vehicle moves along the line of the pipeline, on the surface of the earth, and is guided so as to be centered over the pipeline. The structure which supports the frame of the magnetic flux detectors, is adapted to be moved horizontally in a direction perpendicular to the pipeline, so that it can be precisely centered over the pipeline.

The measurement of flux is provided by two spaced apart, parallel, vertical, flux detectors, which are spaced one on each side of the vertical plane through the pipeline. In this arrangement the vertical component of the earth's magnetic flux in the direction through the two detectors will be substantially equal.

In order to determine when the frame is centered over the pipeline, there is a vertical core and coil mounted on the frame, at the center line of the frame, vertically below the pivot support for the frame. Signals induced on this coil by alternating current disturbances normally present on the pipe vanish when the coil is aligned as shown in the drawing. This arrangement provides full indication of the position of the frame with respect to the pipe.

When there is a vanishing response of this first coil, the frame is centered over the pipe.

If there is an electrical current flowing in the pipe, then there will be a circumferential magnetic field around the pipe, some of the flux will flow upwardly in one detector and downwardly in the other detector at a given instant. The magnitude of this additional flux is a function of the current in the pipe, of the spacing between the detectors and the pipe, and other factors. Whereas the magnetic flux in the detectors due to the earth's field are equal and are in the same direction, the magnetic flux to the instantaneous current on the pipe will be equal but in opposite direction. Therefore, it is possible to separate and measure the portions of the magnetic flux in the detectors which is due to the current in the pipe.

One or a plurality of coils are provided on each of the flux detector cores and by suitable instrumentation a measurement of the corresponding portion of the magnetic flux can be made and, therefore, the current in the pipeline determined.

An important measurement for determining the value of the current as a function of the magnetic flux due to the current is to determine the vertical spacing between the frame, carrying the flux detectors, and the pipe. This is determined by a second core and coil similar to the first core and coil, but arranged to pivot about a horizontal axis parallel to the pipe, and spaced a selected distance from the first coil, laterally of the pipe. The second core and coil is rotated, until it indicates a vanishing response, which is the condition when the second coil is axially aligned with the pipe as pictured in FIG. 2. By measuring the angle of tilt, and knowing the spacing between the dirt and second coils, the depth of the pipe below the frame can be determined.

BRIEF DESCRIPTION OF THE DRAWINGS

These and other objects and advantages of this invention and a better understanding of the principles and details of the invention will be evident from the following description taken in conjunction with the drawings, in which:

FIG. 1 illustrates in a schematic manner the creation of a unidirectional current flow in a buried pipeline due to the presence of a void or holiday through a circumferential electrical insulating coating.

FIG. 2 illustrates schematically one embodiment of this invention.

FIG. 3 illustrates the manner in which the effect of a North seeking magnetic pole on the pipe is separated from the magnetic field of the pipe current, so as to permit measurement of the magnetic field due to current in the pipe.

FIGS. 4 and 5 indicate prior art apparatus for determining the magnitude of the flux through the flux detectors.

DESCRIPTION OF THE PREFERRED EMBODIMENT

Referring now to the drawings and in particular to FIG. 1, there is shown in schematic fashion in cross-section, a buried pipeline 12 in the earth 10. Having an electrically insulating coating 14 around the pipe, except for a small area 16 having a break or holiday in the coating 14, where the pipe is exposed, and is contacted by the earth 10. Currents may be set up in the earth due to the electrolytic conditions at the point 16, so that current 17 will flow from pipe 12 to the earth 10. Consequently, currents 13 and/or 15 will be set up, flowing longitudinally. The lengths of the arrows 13 and 15 diagrammatically indicate the magnitude of the electrical current.

It will be clear that various other situations arise where there may be two or more breaks 16 in the insulating coating 14, and currents will be set up in the pipe due to the current flow between these multiple breaks in the insulated coating.

The apparatus of this invention is designed to detect the presence of currents such as 13 and 15, flowing within the pipeline which is buried at a selected depth 27, shown in FIG. 2, in a known direction and position in the earth 10.

Referring now to FIG. 2, there is shown one embodiment of the apparatus of this invention. The surface 22 of the earth 10 covers a buried pipe 24 which is directed into and perpendicular to the plane of the drawing. The cross 26 indicates a current flowing in the pipe, in the direction into the plane of the drawings. As a result of the current 26 in the pipe, there is magnetic flux around the pipe indicated by the lines 28 which encircle the pipe.

Above the pipe 24 is shown a simple nonmagnetic vehicle 30, which is mounted on wheels 33 for transport. The vehicle 30 carries an upright frame 32, which has near its top, a horizontal pivot 34 which forms an axis parallel to the pipe 24.

In operation, the vehicle is maintained in a direction with its longitudinal axis directed parallel to the pipe 24. If possible, the vehicle is centered directly over the pipe, with its center line coincident with the vertical plane through the pipe, the trace of which is indicated by the dashed line 82. The vertical plane through the pipe also passes through the pivot 34.

If the vehicle is not precisely centered, the frame 32 is arranged to be moved in the direction of arrows 33A or 33B transverse to the pipeline, so that the pivot 34 can be placed in and perpendicular to the vertical plane 82 passing through the pipe.

A planar frame indicated generally by the numeral 36 is made of non-magnetic material and comprises an upper horizontal bar 38, a lower horizontal bar 40 with vertical spacers 41 and 42. The upper bar 38 has a triangular extension 44 which is supported on the axis 34 carried by the frame 32. Thus, the frame 36 is pendulous, and while it rests, will hang with the bars 40 and 38 substantially horizontal. On the vehicle, there is a tank 98 shown in dashed lines carrying a viscous liquid 99 and a paddle 97, which depends from the bar 40. As the frame 36 tends to rotate about the pivot 34, the paddle 97 moves laterally in the viscous liquid 99, and the effect is to damp out any oscillations, or rotations of the frame, so that it hangs quietly and substantially vertically below the pivot 34.

There are a pair of magnetic flux detectors generally indicated by the numerals 45A and 45B which are identical, and are supported by the bar 38 to which the detector cores 46A, 46B are clamped by means 48 well known in the art. The cores 46A and 46B are made of suitable magnetic material having a suitable magnetic characteristic, whereby they saturate at a selected small value of magnetizing current or flux. The manner in which the flux detectors operate is not novel, and can be substantially the type of flux detectors which are fully described in the literature and are indicated, for example, by the patent to G. Barth U.S. Pat. No. 2,252,059. There is a second patent to Fearon, U.S. Pat. No. 2,520,677 which illustrates further refinements in the measurement of flux using pairs of flux detectors, which can be applied to the purpose of this invention. Other types of magnetic flux detector circuits are of course possible, and the invention does not lie specifically in the manner in which the flux in the detectors is measured. Rather, the invention lies in the complete system in which the flux detectors, per se, are only a part.

Digressing for a moment and referring to FIGS. 4 and 5, there are shown two prior art apparatus assemblies for making an indication and/or a measurement of the unidirectional flux density in the air at a selected point. These figures are based upon illustration in the U.S. Pat. No. 2,252,059 of G. Barth which issued Aug. 12, 1941.

Briefly, in FIG. 4, a long rod-like core 85 of high permeability ferromagnetic material is provided, with a helical coil 86 wound around the center of the core, and supplied with an alternating voltage 87. A current detector 88 is provided. Knowing the applied voltage and the current, the impedance of the coil 86 can be determined. That impedance will be a function of the structure of the core 85, the coil 86, the ambient flux, and so on, as is well known in the art.

In FIG. 5 is shown an improvement on the simple apparatus of FIG. 4, in which the coil 86 is still used with a high frequency source 87 of voltage, and a current measuring means 88. In addition, however, there is a coil 93 wound around the core 96 to which a d.c. current can be supplied, from a battery 95 through a rheostat 96 and a reversing switch 94 control of the current, and the direction of the current, in the coil 93 a constant uni-directional flux can be set up in the core, which can be used to supplement or oppose any direct flux in the core due to the ambient flux at that position over the earth.

In other words, referring to the description of this type of apparatus in the Barth patent, it is seen that the use of the coil 86 in the manner indicated, in combination with the coil 93, and apparatus for introducing a supplementary constant flux, a precise indication of the total flux collected by the core separate from that induced by the coil 93 can be determined.

As also described by Barth, and others, a third coil 90 can be provided which, in combination, with an amplifier 91 and a current indicator 92, can be used to provide a more precise measure of the flux in the core.

It does not appear necessary or desirable to go further into the description of the flux detectors themselves, since this art is old and well known. Further reference is also made to the Fearson U.S. Pat. No. 2,520,677, which describes an apparatus involving two similar detectors which have three coils, or possibly four coils, and which can be used in a differential manner to make measurement of the vertical component of the earth's magnetic field at spaced positions. This utilizes two oscillators of different frequencies and a complex amplifier, balanced modulator and a third oscillator, and so on, which is fully described in the Fearson patent, and need not be repeated at this point.

Therefore, by the use of the two vertical flux detectors such as 45A and 45B, illustrated and described above, a determination of the vertical flux in the cores 46A and 46B can be made.

However, to convert this value of flux back to the magnitude of current in the pipeline, it is important to know the distance from the detectors 45A and 45B to the pipeline. For this purpose, as shown in FIG. 2, there are mounted two cores 68 and 72 respectively, each carrying suitable coils 70 and 76, respectively. The first core and coil 68, 70 is mounted in a vertical direction, directly below the axis 34. The axis of this core 68 lies in the vertical plane 82 through the pipeline. At a known distance 51 to one side from the vertical plane 82 is the second core and coil 72 and 76, which is pivoted about a horizontal axis 74, directed parallel to the pipe 24. The core and coil 72, 76 can be rotated as indicated by the arrow 78 about the axis 74. These two cores and coils 68, 70 and 72, 76 are similar to the conventional well known metal detector coils, which are used in a manner in keeping with the art of pipeline location.

Knowing the spacing 51 between the two coils, and the angle 80 of one coil with respect to the horizontal, the vertical distance 27 and 53 between the center of the pipe and the center of the coils 70 and 76 can be determined. Thus, knowing the vertical distance 27 and 53 and the dimensions of the frame 36, the distance from the pipe to the cores of the magnetic flux detector system, including elements 45A and 45B can be determined.

The flux lines 28A and 28B which encircle the pipe 24 are shown flowing vertically upwardly in the detector 45A through the horizontal magnetic bar 50 at the top of the cores 46A and 46B and down through the core 46B of the second detector 45B, and thence down and around the pipe.

Two coils 58A and 58B are shown wound around the magnetic bar 50. A biasing current can be provided through the leads 66 for the coils, for generating a flux through the circuit of the two detectors 45A and 45B, plus the bar 50, etc. This is shown in FIG. 5 by means of a coil such as 93 and a battery 95, rheostat 96 with a reversing switch 94. Thus dependent on the direction of current in the pipe, the biasing flux to overcome the flux in the system due to the current in the pipe, can be inverted so as to change whenever the current in the pipe is in an opposite direction.

In FIG. 3 is shown a base line 100 and a curve 102 which represents schematically the flux density of the earth's vertical component of magnetic flux, in a plane perpendicular to the direction of the pipe 24. In a free open space, without magnetic material, the vertical component of the earth's magnetic field will be uniform and the flux passing through each of the detector cores 46A and 46B will be the same. This is indicated by the three detectors 68 which represent the core 68 and coil 70 which is centered as shown by the line 108, directly above the center of the curve 102. Mounted symmetrically on each side of the core 68 are the two cores 46A and 46B which indicate that even though the flux density due to the earth's field in the vicinity of the pipe is not uniform, it is symmetrical about the pipe. In other words, the greatest flux density in accordance with the curve 102 will be directly over the pipe and will be symmetrically less at equal distances on either side of the pipe. Thus, in the absence of current, the intensity of the flux in each of the cores will be given by the value of the line 112.

However, when the current flows in the pipe 24, there will be the circular flux 28 set up, so that there will be a vertical flux 28A rising in the core 46A and flux 28B descending in the core 46B. Thus, the flux due to the current 26 will add to the earth's flux in one core, and subtract from the earth's flux in the other core, making the flux in each of the cores different, as shown by the dashed line 104, which represents the resultant flux over the pipe and the lines 114 and 116 which represent the flux passing through the cores 46A and 46B, respectively.

It is clear, therefore, that what has been described is an apparatus which can be mounted on a suitable non-magnetic vehicle and positioned at a sequence of positions along the pipeline. The vehicle carries a framework which is maintained in a truly vertical position and carries two magnetic flux detectors in the plane of the frame which is perpendicular to the direction of the pipe, and the two cores 46A and 46B of the detectors are parallel to each other and vertical. Differential flux measurements can be made in the cores 46A and 46B and can be calibrated in terms of current in the pipeline and further in terms of the spacing 27 and 53 above the pipeline.

Therefore, by progressing along the pipeline, making measurements of the unbalanced flux in the cores 46A and 46B, determination can be made of the magnitude and direction of the currents 13 and 15 in the pipeline 24. Thus, as the detectors pass over the point 16, which represents the position of the failure of holiday in the electrical insulating coating of the pipe, the current indicated by the detectors 45A and 45B will change in direction from that of the current arrow 13 to the arrow 15 or vice versa, and will therefore indicate the position 16 of the failure in the coating.

The leads 60 connect the pair of coils 52A, 52B in series. The coils 54A, 54B are connected in series to the leads 62. The coils 56A, 56B are connected in series to the leads 64 and so on. In that case one of the three pairs of coils such as 52A, 52B are connected through leads 60 to the biasing potential, such as the battery 95, potentiometer 96 and reversing switch 94. The other two pairs of coils 54 and 56 correspond to the coils 90 and 86 respectively of FIG. 5.

Other configurations of coils can be used, as has been mentioned in order to determine the flux in the cores 46A and 46B, and the invention is not to be limited in any way by the particular arrangements of coils and measuring instruments suggested in FIGS. 4 and 5, based upon prior art. No further detail of the electrical measuring circuits other than that shown is believed to be necessary inasmuch as art on the measurement of flux in a core is well described in the literature, and need not be described in greater detail. It is the system and configuration of the complete apparatus of this invention, which is the important thing, and not the particular detail of the measurement of flux in the cores.

While the invention has been described with a certain degree of particularity, it is manifest that many changes may be made in the details of construction and the arrangement of components without departing from the spirit and scope of this disclosure, such as the Helium and or the Rubidium magnetometer, well known in geophysics. It is understood that the invention is not limited to the embodiments set forth herein for purposes of exemplification, but is to be limited only by the scope of the attached claim or claims, including the full range of equivalency to which each element thereof is entitled.

What is claimed:

1. Apparatus for detecting and determining the amplitude and direction of any electric current that may be flowing axially in a buried pipeline in the earth, at a selected point along said pipeline, comprising:
    (a) first and second magnetic flux detectors spaced apart horizontally a selected distance;
    (b) said detectors mounted with axes vertical, on a non-magnetic frame, the plane of which is substantially perpendicular to the direction of the pipeline, at a selected distance above the pipeline;
    (c) means to position said frame and flux detectors along said pipeline at said selected point with said detectors positioned symmetrically, one on each side of the vertical plane through the pipeline, whereby the vertical component of the earth's magnetic field will be equal, and the same direction, while the magnetic flux due to an axial current in said pipeline will be in opposite directions in each of said two detectors;
    (d) means for making a single point measurement by differentially connecting said first and second flux detectors so as to determine the flux through said detectors due to an axial current in said pipeline at said selected point; and including;
    (e) vertical third magnetic flux detector means, positioned with its axis midway between said first and second magnetic flux detectors;
    (f) fourth magnetic flux detector positioned at a known selected distance horizontally from said third magnetic flux detector, said fourth magnetic flux detector pivoted for rotation about a horizontal axis in said vertical plane perpendicular to said pipeline;
    (g) means to rotate said fourth magnetic flux detector means until a minimum flux passes through it; and
    (h) means for determining the angle between the horizontal and the axis of said fourth detector;
    whereby the vertical distance between said first and second magnetic flux detectors and the axis of said pipeline can be determined.

2. The apparatus as in claim 1 including means to position said frame in a vertical plane perpendicular to said pipeline and symmetrical about the vertical plane through said pipeline.

3. The apparatus as in claim 1 including means to determine the vertical distance between said frame and said pipeline.

4. The apparatus as in claim 1 wherein said flux detectors are identical and each has an elongated core of magnetic material and at least one coil wound around each of said cores.

5. The apparatus as in claim 4 in which there is a single coil per core of said flux detectors.

6. The apparatus as in claim 4 in which each of said flux detectors has a primary coil, a secondary coil and a magnetic flux biasing coil.

7. The apparatus as in claim 1 in which said frame is supported pendulously from a vehicle whereby said flux detectors are held with their axes vertical.

8. The apparatus as in claim 7 including damping means between said frame and said vehicle.

9. In an apparatus for detecting and determining the amplitude and direction of any electric current that may be flowing in a buried pipeline in the earth, at a selected point along said pipeline, comprising;
    (a) first and second horizontally spaced apart vertical magnetic flux detectors on a vertical plane;
    (b) a third vertical magnetic flux detector on said vertical plane with its axis midway between said first and second detectors;
    the method of operation of said apparatus comprising;
    (c) positioning said first, second and third flux detectors in said vertical plane along said pipeline at said selected point with said vertical plane perpendicular to the axis of said pipeline with said third detector vertically above said pipeline and said first and second detectors positioned symmetrically, one on each side of the vertical plane through the pipeline;
    (d) laterally adjusting the positions of said three detectors until a minimum flux passes through said third detector;
    whereby said third detector will be vertically above the axis of said pipeline;
    (e) making a differential measurement of the flux passing through said first and second detector;
    whereby a function of the magnitude of said current in said pipeline can be determined;
    (f) a fourth magnetic flux detector on said vertical plane adapted for rotation about a horizontal axis perpendicular to said plane, and spaced horizontally a selected distance from said third detector;
    and including the additional step of:
    (g) rotating said fourth detector until a minimum flux passes through it; and
    (h) determining the angle between the horizontal and the axis of said fourth detector;
    whereby the magnitude of said current can be determined.

* * * * *